United States Patent
Rivas et al.

(10) Patent No.: US 10,088,533 B2
(45) Date of Patent: Oct. 2, 2018

(54) INTEGRATED MAGNETIC FIELD SENSOR AND METHOD OF POWERING ON AND OFF A LOAD

(71) Applicant: Allegro Microsystems, LLC, Worcester, MA (US)

(72) Inventors: Manuel Rivas, Ciudad de Buenos Aires (AR); Gerardo A. Monreal, Buenos Aires (AR); Christine M. Graham, Bow, NH (US); Eric G. Shoemaker, Windham, NH (US)

(73) Assignee: Allegro MicroSystems, Inc., Manchester, NH (US)

( * ) Notice: Subject to any disclaimer, the term of this patent is extended or adjusted under 35 U.S.C. 154(b) by 295 days.

(21) Appl. No.: 14/993,495

(22) Filed: Jan. 12, 2016

(65) Prior Publication Data

US 2016/0200245 A1  Jul. 14, 2016

Related U.S. Application Data

(60) Provisional application No. 62/103,190, filed on Jan. 14, 2015.

(51) Int. Cl.
| | |
|---|---|
| *B60Q 3/80* | (2017.01) |
| *G01R 33/06* | (2006.01) |
| *G01R 33/07* | (2006.01) |
| *G06F 3/046* | (2006.01) |
| *G01R 33/00* | (2006.01) |
| *G05F 3/08* | (2006.01) |
| *H05B 33/08* | (2006.01) |
| *B60Q 3/20* | (2017.01) |
| *B60Q 3/30* | (2017.01) |

(52) U.S. Cl.
CPC ............. *G01R 33/072* (2013.01); *B60Q 3/20* (2017.02); *B60Q 3/30* (2017.02); *B60Q 3/80* (2017.02); *G01R 33/007* (2013.01); *G01R 33/0082* (2013.01); *G01R 33/07* (2013.01); *G05F 3/08* (2013.01); *H05B 33/0854* (2013.01)

(58) Field of Classification Search
None
See application file for complete search history.

(56) References Cited

U.S. PATENT DOCUMENTS

| | | |
|---|---|---|
| 5,099,687 A | 3/1992 | Lunzer et al. |
| 6,356,741 B1 | 3/2002 | Bilotti et al. |
| 6,622,012 B2 | 9/2003 | Bilotti et al. |
| 6,982,527 B2 | 1/2006 | Lee et al. |
| 7,085,119 B2 | 8/2006 | Bilotti et al. |

(Continued)

FOREIGN PATENT DOCUMENTS

CN  203057046  7/2013

OTHER PUBLICATIONS

"Automotive LED Array Driver," Allegro Microsystems, LLC, A6269-DS, Rev. 7; Mar. 1, 2013; 15 pages.

(Continued)

*Primary Examiner* — Dedei K Hammond
(74) *Attorney, Agent, or Firm* — Daly, Crowley, Mofford & Durkee, LLP

(57) ABSTRACT

An integrated magnetic field sensor includes a magnetic field sensing circuit and a power driving circuit disposed upon or within a common substrate. A method of powering on and off a load uses the above integrated magnetic field sensor.

60 Claims, 9 Drawing Sheets

(56) References Cited

U.S. PATENT DOCUMENTS

| | | | |
|---|---|---|---|
| 7,307,824 B2 | 12/2007 | Bilotti et al. | |
| 7,675,245 B2 | 3/2010 | Szczeszynski et al. | |
| 7,783,399 B1 * | 8/2010 | Young | B60Q 1/40 340/475 |
| 8,274,238 B2 | 9/2012 | Szczeszynski et al. | |
| 8,339,049 B2 | 12/2012 | Kang et al. | |
| 8,456,105 B2 | 6/2013 | Wang et al. | |
| 8,519,630 B2 | 8/2013 | Wang et al. | |
| 8,664,930 B2 | 3/2014 | Kang et al. | |
| 8,692,482 B2 | 4/2014 | Szczeszynski et al. | |
| 8,742,682 B1 | 6/2014 | Wang et al. | |
| 8,901,835 B2 | 12/2014 | Kang et al. | |
| 8,937,433 B1 | 1/2015 | Wang et al. | |
| 2002/0159270 A1 * | 10/2002 | Lynam | B60K 35/00 362/492 |
| 2003/0141862 A1 * | 7/2003 | Vig | G01D 5/145 324/174 |
| 2010/0211347 A1 | 8/2010 | Friedrich et al. | |

OTHER PUBLICATIONS

"Hall-Effect Latch/Bipolar Switch;" Allegro Microsystems, LLC, A1250-DS, Rev. 4; Apr. 1, 2012; 12 pages.

PCT International Search Report and Written Opinion of the ISA dated Apr. 12, 2016; for PCT. Pat. App. No. PCT/US2016/012986; 12 pages.

Letter Relating to the Search and Examination Procedure dated Mar. 5, 2018 for European Application No. EP 16701709.4; 2 pages.

Amended Claims with Annotations dated Mar. 5, 2018 for European Application No. EP 16701709.4; 5 pages.

Extended European Search Report dated May 17, 2018 for EP Pat. Appl. No. 18164858.5; 12 pages.

\* cited by examiner

Terminal List

| Symbol | Description | Pin Number Package LJ |
|---|---|---|
| VIN | Supply | 1 |
| SEN_EN | Enable | 2 |
| EXT | External Input | 3 |
| LA | LED anode (+) connection | 4 |
| GND | Ground reference | 5 |
| THTH | Thermal threshold | 6 |
| IREF | Current reference | 7 |
| FADE | Soft start control | 8 |
| PAD | Exposed thermal pad | - |

FIG. 3

INTEGRATED MAGNETIC FIELD SENSOR AND METHOD OF POWERING ON AND OFF A LOAD

CROSS REFERENCE TO RELATED APPLICATIONS

This application claims the benefit under 35 U.S.C. § 119(e) of U.S. Provisional Application No. 62/103,190 filed Jan. 14, 2015, which application is incorporated herein by reference in its entirety.

STATEMENT REGARDING FEDERALLY SPONSORED RESEARCH

Not Applicable.

FIELD OF THE INVENTION

This invention relates generally to magnetic field sensors and, more particularly, to a magnetic field sensor and power driver combination integrated onto a common substrate.

BACKGROUND

Many applications exist where it is desirable to turn on a light, or to take some other electrical power action, in response to a physical state (e.g., a position) of an object. For example, a typical automobile uses a mechanical switch to sense an open door, and in response to closure of the mechanical switch, a light inside the automobile is turned on.

Mechanical switches tend to be expensive and subject to wear and corrosion. Mechanical switches can fail.

It would be desirable to sense the physical state (e.g., open or closed) of an object (e.g., a door) without a mechanical switch and to take an electrical action, e.g., turn on a light, in response thereto.

SUMMARY

The present invention is operable to sense the physical state (e.g., open or closed) of an object (e.g., a door) without a mechanical switch and to take an electrical action (e.g., turn on a light) in response thereto. In particular, the present invention provides an integrated magnetic field sensor that both senses the state and that takes the electrical action.

In accordance with an example useful for understanding an aspect of the present invention, an integrated magnetic field sensor can include a semiconductor substrate disposed within an integrated circuit package; a magnetic field sensing circuit disposed upon or within the substrate and operable to generate a two-state signal responsive to a magnetic field; and a power driving circuit disposed upon or within the substrate and operable to generate, in response to the two-state signal, a power driving signal having a higher power state and a lower power state.

In some embodiments, the above integrated magnetic field sensor can include one or more of the following aspects in any combination.

In some embodiments of the above integrated magnetic field sensor, the higher power state is operable to provide at least one hundred seventy milliamps of current.

In some embodiments of the above integrated magnetic field sensor, the integrated circuit package comprises a thermal pad configured to thermally couple the substrate to a circuit board.

In some embodiments of the above integrated magnetic field sensor, the integrated magnetic field sensor is operable up to an environmental temperature of about one hundred twenty five degrees Celsius.

In some embodiments of the above integrated magnetic field sensor, the power driving circuit comprises a temperature sensor disposed upon or within the substrate; and a temperature compensation circuit responsive to the temperature sensor and operable to reduce the higher power state of the power driving signal to a reduced power state at environmental temperatures above a threshold temperature.

In some embodiments of the above integrated magnetic field sensor, the threshold temperature is determined by a passive electronic component coupled to the integrated magnetic field sensor.

In some embodiments of the above integrated magnetic field sensor, the threshold temperature comprises a plurality of threshold temperatures and wherein the temperature compensation circuit is operable to reduce the higher power state of the power driving signal to a corresponding plurality of different reduced power states at environmental temperatures above respective ones of the plurality of threshold temperatures.

In some embodiments of the above integrated magnetic field sensor, the power driving circuit further comprises a slew limit circuit operable to limit a rate of change of the power driving signal between the higher power and lower power states.

In some embodiments of the above integrated magnetic field sensor, the integrated circuit package further comprises a permanent magnet for generating the magnetic field.

In some embodiments of the above integrated magnetic field sensor, the integrated circuit package further comprises a conductor disposed upon or within the semiconductor substrate and proximate to the magnetic field sensing circuit, the conductor for generating the magnetic field.

In some embodiments of the above integrated magnetic field sensor, the magnetic field sensing circuit comprises:

a magnetic field sensing element disposed upon the semiconductor substrate;

a conductor disposed upon the semiconductor and proximate to the magnetic field sensing element; and a self-test circuit operable to drive a current into the conductor to generate a self-test of the integrated magnetic field sensor.

In some embodiments of the above integrated magnetic field sensor, the magnetic field sensing circuit comprises a power on reset circuit operable to hold the two-state signal or to hold the power driving circuit into a condition to result in the lower power state for a predetermined time period following a time when power is applied to the integrated magnetic field sensor.

In some embodiments of the above integrated magnetic field sensor, the higher power state is operable to provide at least one hundred seventy milliamps of current, wherein the magnetic field sensing circuit comprises a Hall effect element having first, second, third, and fourth electrical connection nodes disposed upon the semiconductor substrate, and wherein the power driving circuit is disposed at a position upon the semiconductor substrate to result in a predetermined thermal gradient direction at a position of the Hall effect element with respect to positions of the first, second, third, and fourth connections nodes.

In some embodiments of the above integrated magnetic field sensor, the higher power state is operable to provide at least one hundred seventy milliamps of current, wherein the magnetic field sensing circuit comprises a Hall effect element disposed upon the semiconductor substrate, and wherein the power driving circuit is disposed at a position upon the semiconductor substrate to result in a thermal gradient at a position of the Hall effect element smaller than one degree Celsius.

In accordance with an example useful for understanding another aspect of the present invention, method of powering on and off a load can include providing an integrated magnetic field sensor, the integrated magnetic field sensor comprising: a semiconductor substrate disposed within an integrated circuit package; a magnetic field sensing circuit disposed upon or within the substrate and operable to generate a two-state signal responsive to a magnetic field; and a power driving circuit disposed upon or within the substrate and operable to generate, in response to the two-state signal, a power driving signal having a higher power state and a lower power state. The method can further include sensing a change of the magnetic field with the integrated magnetic field sensor, wherein the higher power state and the lower power state are achieved at different respective strengths or angles of the magnetic field.

In some embodiments, the above method can include one or more of the following aspects in any combination.

In some embodiments, the above method, the load is an automobile light.

In some embodiments, the above method further comprises generating the magnetic field with a back-biasing magnet, the magnetic field influenced by a ferromagnetic object.

In some embodiments of the above method, the higher power state is operable to provide at least one hundred seventy milliamps of current.

In some embodiments of the above method, the integrated circuit package comprises a thermal pad configured to thermally couple the substrate to a circuit board.

In some embodiments of the above method, the integrated magnetic field sensor is operable up to an environmental temperature of about one hundred twenty five degrees Celsius.

In some embodiments of the above method, the power driving circuit comprises:
a temperature sensor disposed upon or within the substrate; and
a temperature compensation circuit responsive to the temperature sensor and operable to reduce the higher power state of the power driving signal to a reduced power state at environmental temperatures above a threshold temperature.

In some embodiments of the above method, the threshold temperature is determined by a passive electronic component coupled to the integrated magnetic field sensor.

In some embodiments of the above method, the threshold temperature comprises a plurality of threshold temperatures and wherein the temperature compensation circuit is operable to reduce the higher power state of the power driving signal to a corresponding plurality of different reduced power states at environmental temperatures above respective ones of the plurality of threshold temperatures.

In some embodiments of the above method, the power driving circuit further comprises a slew limit circuit operable to limit a rate of change of the power driving signal between the higher power and lower power states.

In some embodiments, the above method further comprises generating the magnetic field with a permanent magnet.

In some embodiments, the above method further comprises generating the magnetic field with a conductor.

In some embodiments of the above method, the magnetic field sensing circuit comprises:
a magnetic field sensing element disposed upon the semiconductor substrate;
a conductor disposed upon the semiconductor and proximate to the magnetic field sensing element; and
a self-test circuit operable to drive a current into the conductor to generate a self-test of the integrated magnetic field sensor.

In some embodiments of the above method, the magnetic field sensing circuit comprises:
a power on reset circuit operable to hold the two-state signal or to hold the power driving circuit into a condition to result in the lower power state for a predetermined time period following a time when power is applied to the integrated magnetic field sensor.

In some embodiments of the above method, the higher power state is operable to provide at least one hundred seventy milliamps of current, wherein the magnetic field sensing circuit comprises a Hall effect element having first, second, third, and fourth electrical connection nodes disposed upon the semiconductor substrate, and wherein the power driving circuit is disposed at a position upon the semiconductor substrate to result in a predetermined thermal gradient direction at a position of the Hall effect element with respect to positions of the first, second, third, and fourth connections nodes.

In some embodiments of the above method, the higher power state is operable to provide at least one hundred seventy milliamps of current, and the magnetic field sensing circuit comprises a Hall effect element disposed upon the semiconductor substrate, and wherein the power driving circuit is disposed at a position upon the semiconductor substrate to result in a thermal gradient at a position of the Hall effect element smaller than one degree Celsius.

BRIEF DESCRIPTION OF THE DRAWINGS

The foregoing features of the invention, as well as the invention itself may be more fully understood from the following detailed description of the drawings, in which:

FIG. 3 is a graph showing an example of pin assignments of the integrated magnetic field sensor of FIG. 2;

DETAILED DESCRIPTION

Figure 1:
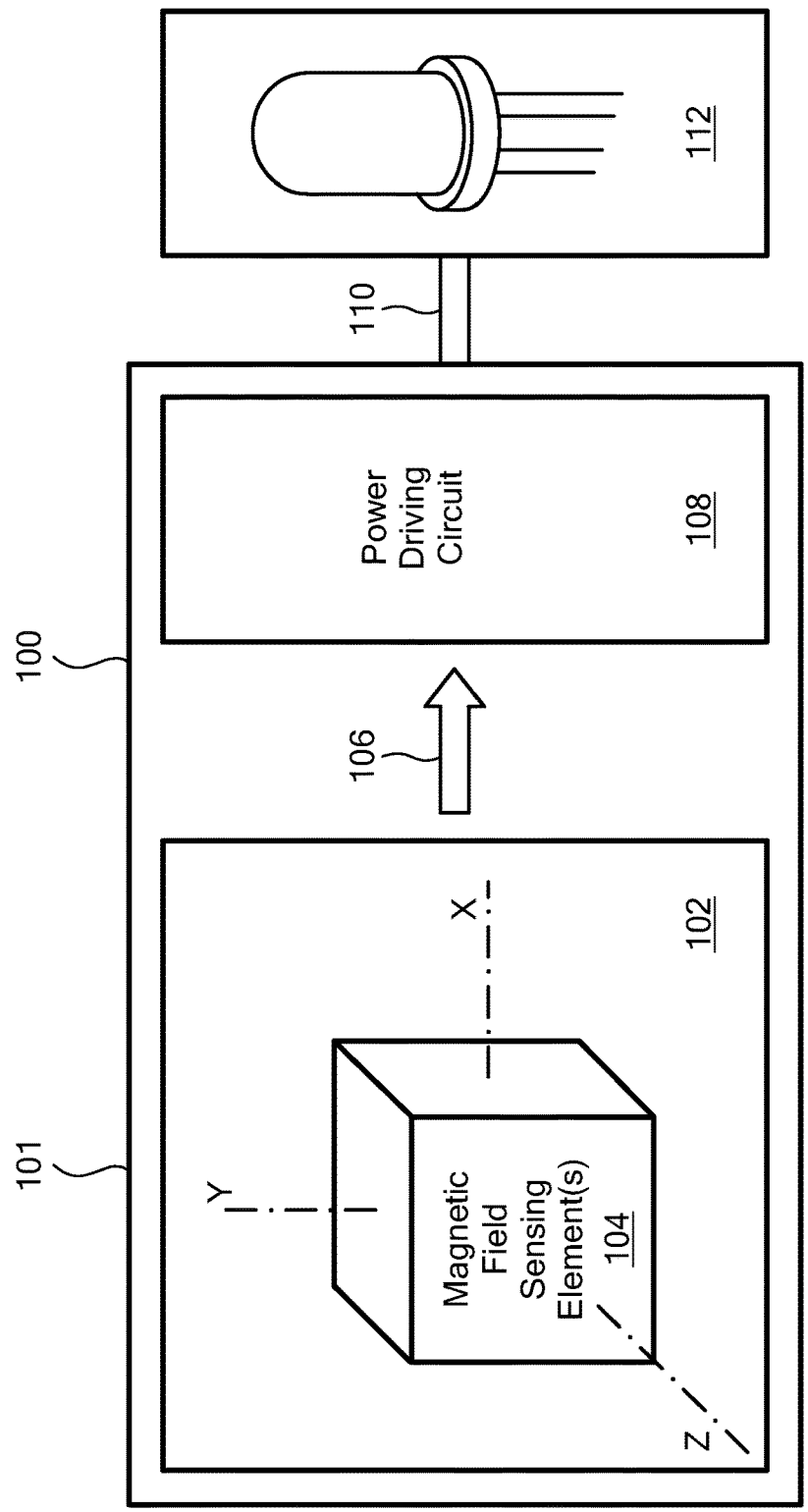
FIG. 1 is a pictorial showing an integrated magnetic field sensor having a magnetic field sensing circuit and a power driving circuit.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMS, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

As used herein, the term "baseline" and the phrase "baseline level" are used to describe a lowest magnitude (which may be near zero or may be some other magnetic field) of a magnetic field experienced by a magnetic field sensing element within a magnetic field sensor when the magnetic field sensor is operating in a system.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuit shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two state output signal indicative of an input signal being above or below a threshold level. However the comparator can also be comprised of a digital circuit having an output signal with at least two states indicative of an input signal being above or below a threshold level.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one par junction. A capacitor and a resistor are examples of passive electronic components.

As used herein, the terms "line" and "linear" are used to describe either a straight line or a curved line. The line can be described by a function having any order.

Referring to FIG. 1, an example of an integrated magnetic field sensor 100 can include a substrate 101 (e.g., a silicon substrate) with a magnetic field sensing circuit 102 and a power driving circuit 108 disposed therein or thereon. The magnetic field sensor circuit 102 can include one or more magnetic field sensing elements 104 operable to sense a magnetic field in directions of one or more of an x-axis, a y-axis, and a z-axis. It will be understood that magnetic field sensing elements tend to have a maximum response axis determined by a type of magnetic field sensing element.

In some embodiments, the one or more magnetic field sensing elements 104 and the magnetic field sensing circuit 102 can be of a type described in U.S. patent application Ser.

No. 14/277,218, filed on May 14, 2014, which is incorporated by reference herein in its entirety.

In some embodiments, the one or more magnetic field sensing elements 104 consist of one Hall element. In other embodiments, the one or more magnetic field sensing elements 104 consist of one magnetoresistance element. In some other embodiments, the one or more magnetic field sensing elements 104 comprise one or more planar (horizontal) Hall effect elements and/or one or more vertical Hall effect elements. In some other embodiments, the one or more magnetic field sensing elements 104 comprise one or more planar Hall effect elements and/or one or more magnetoresistance elements.

The magnetic field sensing circuit 102 is operable to generate a magnetic field signal 106 having a state responsive to a presence or absence of a ferromagnetic object, e.g., a magnet or, for back biased arrangements described below, a ferromagnetic object that is not magnetized.

In some embodiments, the magnetic field signal 106 is a two-state signal (e.g., having high and low states), wherein one of the states is indicative of a ferromagnetic object (e.g., a magnet (not shown) upon an automobile door) being proximate to the magnetic field sensor 100 and the other state being indicative of the ferromagnetic object being distal from the magnetic field sensor 100.

The power driving circuit 108 can be responsive to the magnetic field signal 106 and can generate a higher power state of a power driving signal 110 to power on a light 112 (or alternatively, to power a different load, e.g., a motor) in response to a second state of the magnetic field signal 106 and can generate a lower power state of the power driving signal 110 to power off the light 112 in response to a first different state of the magnetic field signal 106.

In some other embodiments, there can be more than one power driving circuit to drive more than one load, e.g., lights.

Further functional details are described in figures below.

Figure 2:
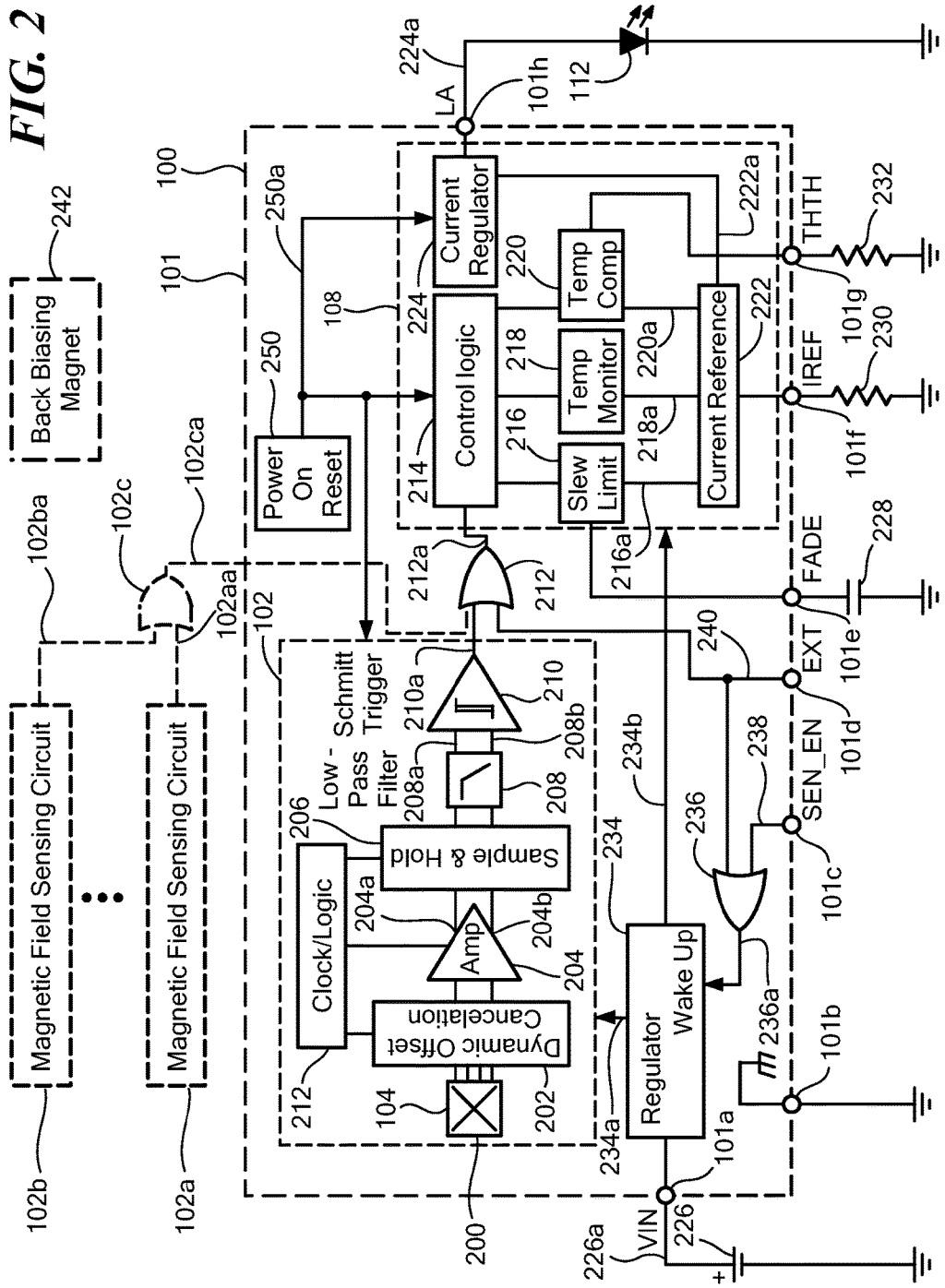
FIG. 2 is a block diagram showing further details of an example of the integrated magnetic field sensor of FIG. 1 and showing further examples of an illustrative magnetic field sensing circuit and an illustrative power driving circuit as used in FIG. 1.

Referring now to FIG. 2, in which like elements of FIG. 1 are shown having like reference designations, the magnetic field sensor circuit 102 can include the one or more magnetic field sensing elements 104, e.g., in the form of a planar (i.e., horizontal) Hall effect element 200. The Hall effect element 200 can be coupled to a dynamic offset cancellation circuit 202, which can provide current spinning upon the Hall effect element 200.

It is known that Hall effect elements tend to generate an offset voltage, i.e., a non zero output signal when in the presence of a zero magnetic field. Current spinning is a technique by which the offset can be reduced. With four-phase current spinning, in a first phase of current spinning, the Hall effect element 200, e.g., a four terminal device, is first driving with a current between two opposing terminals and a first differential signal is generated between the other two opposing terminals. In a second current spinning phase, the current is driving between a different set of two opposing terminals and a second differential output signal is generated between another two opposing terminals. Third and fourth current spinning phases use different sets of opposing terminals to generate third and fourth differential signals. The four output signals essentially average any offset voltage to be near zero. In the frequency domain, with particular phasing of the current spinning, the offset component of the differential signals is shifted to a higher frequency, which the magnetically responsive signal component remains at baseband.

In other embodiments, other current spinning, for example, two-phase current spinning, can be used.

In some other embodiments, the Hall effect element 200 can be representative of two Hall effect elements coupled in series or in parallel. The two Hall effect elements can undergo current spinning, each with the same current spinning phase at the same time, or different current spinning phases at the same time.

The output signals from the dynamic offset cancellation circuit 202 can be received by an amplifier 204, which can generate a differential amplified signal 204a, 204b (or alternatively, a single ended amplified signal). The differential amplified signal 204a, 204b can be received by a sample and hold circuit 206 to generate a differential sampled signal 206a, 206 (or alternatively, a single ended sampled signal).

A low pass filter 208 can filter the differential sampled signal 206a, 206b and can generate a differential filtered signal 208a, 208b (or alternatively, a single ended filtered signal). The low pass filter circuit 208 is operable to remove the above described offset signal component leaving only the magnetically responsive signal component.

A comparator 210, for example, a Schmitt trigger (with hysteresis), can receive the differential filtered signal 208a, 208b and can generate a two-gate signal 210a, indicative of a ferromagnetic object (e.g., a magnet) being close to or far from the Hall effect element 200. Trip points of the comparator 210 can define an operating point and a release point of magnetic fields experienced by the Hall element 200.

A clock circuit 212 can provide clock signals to elements of the magnetic field sensing circuit 102.

An OR gate can be coupled to receive the two-state signal 212 and can generate a two-state logic signal 212a.

Within the power driving circuit 108, control logic 214 (i.e., a processor) can be coupled to receive the two-state logic signal 212a. The control logic 214 can be operable to provide particular control of lighting of a light, e.g., a light emitting diode 112. The particular control is described more fully in conjunction with figures below.

In particular, the power driving circuit 108 can include a slew limit circuit 216, a temperature monitor circuit 218, and a temperature compensation circuit 220.

In some embodiments, the slew limit circuit 216 the temperature monitor circuit 218, and the temperature compensation circuit 220 are coupled to the control logic 214. In some embodiments, one or more of the slew limit circuit 216, the temperature monitor circuit 218, and the temperature compensation 220 are coupled to a current reference circuit 222. In other embodiments, the control logic 214 is coupled to the current reference circuit 222.

The current reference circuit 222 is coupled to a current regulator 224. The current regulator 224 can be operable to generate a power driving signal 224a (e.g., a current signal) that can be used, for example, to turn on or off a light, for example, a light emitting diode 112. The power driving signal 224a can be the same as or similar to the power driving signal 110 of FIG. 1. In some embodiments, the power driving signal 224a can provide at least one hundred seventy milliamps of current when in the higher power state, and can provide less than about ten milliamps when in the lower power state. In other embodiments, the power driving signal 224a can provide at least five hundred milliamps of current.

The substrate 101 can also include, disposed within or upon the substrate 101, a voltage regulator 234. The voltage regulator 234 can provide separate regulated voltages 234a, 234b to the magnetic field sensing circuit 102 and to the power driving circuit 108, respectively. The separate regulated voltages can separate digital noise of the control logic 214 from the magnetic field sensing circuit 102.

In some embodiments, the enable signal 238 can couple through a gate 236 to provide an enable signal 236a to the voltage regulator 234.

The magnetic field sensor 100 can include a power on reset circuit 250 coupled to at least one of the magnetic field sensing circuit 102 or the power driving circuit 108. The power on reset circuit 250 can generate at least one of a power on reset signal 250a or a power on reset signal 250b, each of which can cause the power driving signal 224a to take on the above described lower power state for a predetermined time period beginning at a time when power is applied to the magnetic field sensor 100. With this arrangement, the power driving signal 224a will not momentarily generate the higher power signal while various elements of the magnetic field sensor 100 stabilize at power up.

In some embodiments, a packaged integrated circuit in which the magnetic field sensor 100 resides is specified to operate over an environmental temperature range of about negative forty degrees Celsius to about one hundred twenty-five degrees Celsius, which range is suitable for an automobile environment. In some other embodiments, a packaged integrated circuit in which the magnetic field sensor 100 resides is specified to operate over an environmental temperature range of about negative forty degrees Celsius to about eighty-five degrees Celsius, which range is also suitable for an automobile environment. In some embodiments, the environmental temperature range can be up to about one hundred fifty degrees Celsius.

The power driving circuit 108 being on the same substrate 101 as the current sensing circuit 102, and therefore, in close proximity, can result in a potential that the current driving signal 224a can generate a magnetic field that can influence the Hall effect element 200, which is not desirable.

Also, the substrate 101, being operable to drive the power driving signal 224a into a load, e.g., into the light 112, tends to heat up the substrate 101, and can heat the substrate 101 to a temperature that is above a junction temperature (i.e., an operating temperature) of the Hall element 200, particularly at high environmental temperatures, which is not desirable. Even elevated temperatures below the junction temperature may be undesirable.

Thus, special design considerations described below must be used in order to operate the Hall element 200 on the same substrate 101 as the current regulator circuit 224.

The special design considerations can include a separation of conductive traces and wire bonds within or upon the substrate 101 for the power driving signal 224a and the magnetic field sensing circuit(s) 102, to reduce the influence of a magnetic field generated by the current driving signal 224a. The special design considerations can also include control of a temperature of the substrate 101 by limiting a magnitude of the power driving signal 224a, particularly at high environmental temperatures, for example, by way of the temperature monitor 218 and temperature compensation circuit 220. The special design considerations can also include design control of a direction and/or magnitude of thermal gradients on the substrate 101 at the Hall effect element 200 as further described below.

Even at temperatures below the junction temperature, because the current regulator circuit 224 uses relatively high power, the substrate 101 can heat up by an amount higher than for many other types of magnetic field sensors.

A temperature of the Hall effect element 200 can contribute to the above-described offset voltage. As a temperature of the Hall effect element 200 changes, so too can the offset voltage. As described above, the dynamic offset cancellation circuit 202 can use current spinning to reduce the resulting offset voltage, whether the Hall effect element 200 experiences a static temperature or a changing temperature.

For some particular types of current spinning, for example, two-phase current spinning, the offset voltage can also be influenced by a temperature gradient (static or changing) across the Hall effect element. For the particular types of current spinning, when a Hall effect element experiences the thermal gradient, the resulting offset voltage may not be sufficiently reduced by current spinning. Also, for the particular types of current spinning, the resulting offset voltage may be larger for a thermal gradient in some directions relative to the Hall effect element (i.e., relative to positions of the Hall effect element connection nodes) than in other directions. Thus, for the particular types of current spinning, but also for all types of current spinning, it may be desirable to design an integrated circuit substrate having a Hall effect element disposed thereon such that temperature gradients are reduced, and/or have a predetermined direction relative to positions of the connection nodes of the Hall effect element. In other words, it may be desirable to position higher power circuits upon the integrated circuit substrate at predetermined positions to result in reduced thermal gradients at the Hall effect element, and/or a thermal gradient at the Hall effect element in a particular direction.

The substrate 101 can include a plurality of bonding pads 101a, 101b, 101c, 101d, 101d, 101e, 101f, 101g, 101h. From discussion below, it will be understood that the bonding pads 101a, 101b, 101c, 101d, 101d, 101e, 101f, 101g, 101h can be coupled to pins of a packaged integrated circuit in which the substrate resides, by way of wire bonds, solder pads, or the like.

The bonding pad 101a can be coupled to receive a power supply voltage provided, for example, by a battery 226, for example, an automobile battery.

The bonding pad 101b can be coupled to a circuit ground.

The bonding pad 101c can be coupled to receive an enable signal 238 described more fully below.

The bonding pad 101d can be coupled to receive an external control signal 240 described more fully below.

The bonding pad 101e can be coupled to an external passive component, for example, a capacitor 228.

The bonding pad 101f can be coupled to an external passive component, for example, a resistor 230.

The bonding pad 101g can be coupled to an external passive component, for example, a resistor 232.

The bonding pad 101h can be coupled to the current regulator 224 to provide the power driving signal 224a.

Other bonding pads are described below in conjunction with FIG. 23.

In operation, the power driving signal 224a takes on a higher current state in response to a first predetermined state of the two-state signal 210a, and takes on a lower current state, for example, zero current, in response to a second predetermined state of the two-state signal 210a. As described above the two-state signal 210a is responsive to a magnetic field sensed by the Hall effect element 200. Thus, the magnetic field sensor 100 can turn on the light emitting diode 112 in response to a magnetic field either being sensed or not sensed, and the magnetic field sensor 100 can turn off the light emitting diode 112 in response to the magnetic field taking on the opposite physical condition.

The slew limit circuit 216 can be operable to slow down a slew rate of the power driving signal 224a when changing from the higher current state to the lower current state and/or when changing from the lower current state to the higher current state. To this end, the capacitor 218 can be used to charge up or down to set the slew rate according to a capacitance value of the capacitor 228.

The temperature monitor circuit 218 can include a temperature sensor within and can provide an output signal indicative of a temperature of the substrate 101. In some embodiments, the temperature sensor is a band gap temperature sensor.

The temperature compensation circuit 220 can, for example, be operable to reduce the higher power state of the power driving signal 224a at higher sensed temperatures of the substrate 101 as sensed by the temperature monitor circuit 218. For example, if the substrate 101 is at room temperature, the higher power state of the power driving signal 224a can be about one hundred seventy milliamps, but above about one hundred degrees Celsius, the higher power state of the power driving signal can be reduced to about one hundred milliamps. The reductions of the higher power state of the power driving signal 224a can be a one-step reduction above a threshold temperature, a multi-step reduction associated with a plurality of temperatures, or a continuous reduction according to temperature.

In accordance with the above-described functions of the temperature compensation circuit 220, the resistor 232 can be used to set the above-described threshold and/or the above-described mode of operation.

In operation, the current reference 222 can provide a low current signal 222a to the current regulator circuit 224 to set the higher power state and the lower power state of the current regulator circuit 224. To this end, the resistor 230 can set the low current signal 222a of the current reference 222 so that the higher power state of the current regulator 224 can be nominally controlled by the resistor 230.

While a capacitor 228, resistor 230, and a resistor 232 are shown, other types of passive electronic components can also be used.

While the light 112 is shown to be a light emitting diode, other types of lights, for example an incandescent light, can be driven by the magnetic field sensor 100. In other embodiments, the magnetic field sensor 100 can be used to drive other types of loads, for example an electric motor.

While the magnetic field sensing element 104 is described to be a Hall effect element 200, other types of magnetic field sensing elements can be used.

Shown in phantom lines to indicate optional components, the magnetic field sensor 100 can include one or more other magnetic field sensing circuits, e.g., 102a, 102b upon the substrate 101 and operable to generate other two-state signals 102aa, 102ba indicative of sensed magnetic fields being above or below respective thresholds. The two state signals 102aa, 102ba can be received by an OR gate 102c to provide a logic signal 102ca, which can be combined at the OR gate 212.

With this optional arrangement, the magnetic field sensor 100 can sense magnetic fields in more than one direction, for example, in three directions.

In some embodiments, magnetic field sensing elements within the magnetic field sensing circuits 102a, 102b can comprise vertical Hall effect elements. In some embodiments, magnetic field sensing elements within the magnetic field sensing circuits 102a, 102b can comprise magnetoresistance elements. In some embodiments use magnetoresistance elements, the magnetic field sensing circuits 102a, 102b can each include more than one magnetoresistance element coupled together, for example, in a Wheatstone bridge.

In some embodiments, the magnetic field sensor 100 can include a back-biasing magnet 242. With back biasing, the back biasing magnet 242 can generate a magnetic field sensed by the magnetic field sensing element 104, and the sensed magnetic field changes amplitude and/or direction in response to an approaching or retreating ferromagnetic object (not shown) that is not magnetized.

In some other embodiments, there can be a plurality of power driving circuits like the power driving circuit 108. In some embodiments, the plurality of power driving circuits can drive a plurality of loads, which can be the same type of load, e.g., lights, or different loads, e.g., lights and motors. In some embodiments, each one of the magnetic field sensing circuits, e.g., 102, 102a, 102b, can be separately coupled to one of the above-described plurality of driver circuit so that selected ones of the plurality of loads can be separately activated by separate magnetic fields.

Referring now to FIG. 3, in which like elements of FIG. 2 are shown having like reference designations, pin assignments for the integrated circuit 100 of FIG. 2 are shown, assuming that the package of the integrated magnetic field sensor 100 of FIG. 2 has eight integrated circuit pins. Shown also and described more fully below, is an integrated circuit exposed thermal pad 300.

Figure 4:
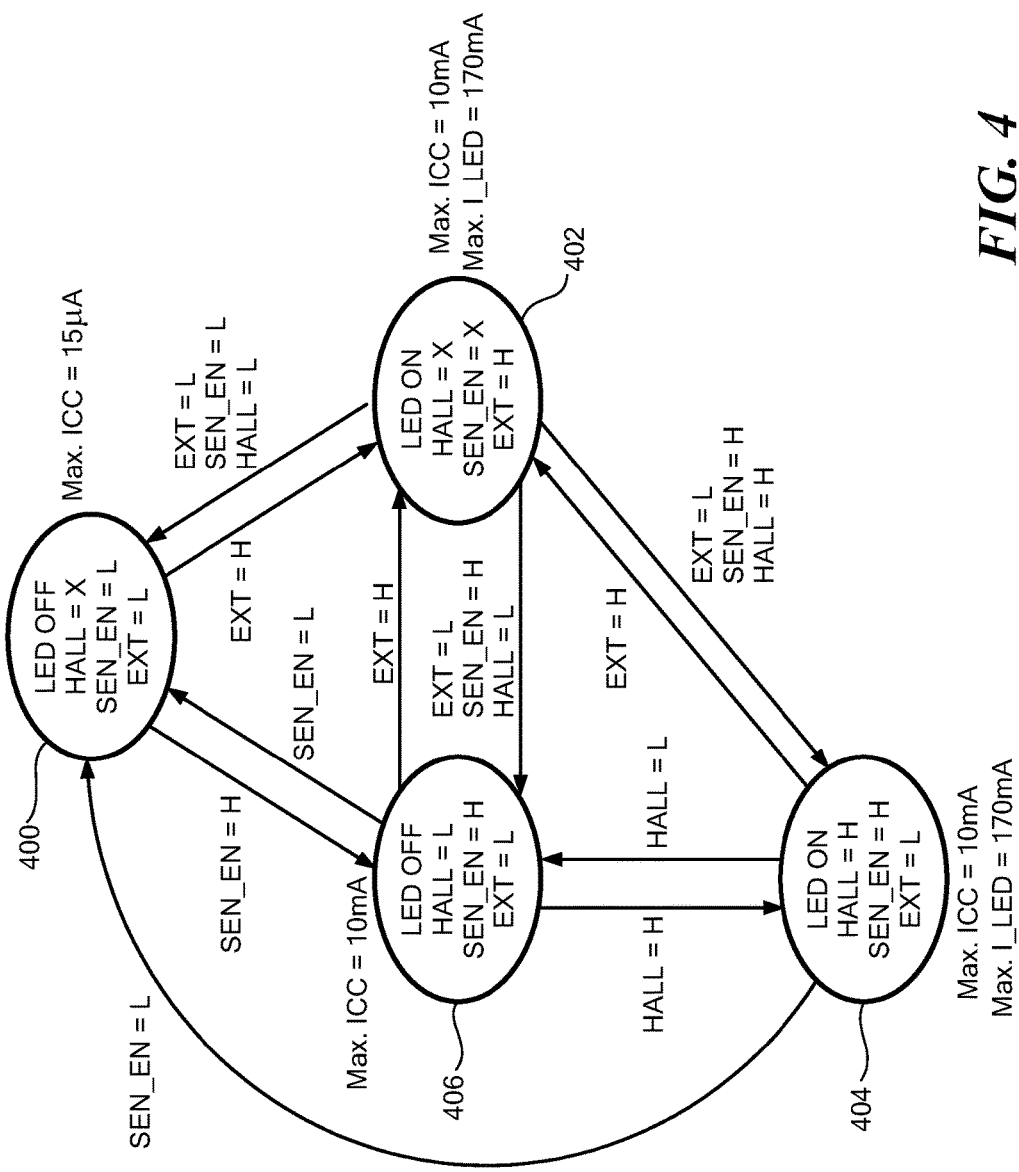
FIG. 4 is a state diagram showing operation of the example of the integrated magnetic field sensor of FIG. 2.

Referring now to FIG. 4, a state diagram shows four states 400, 402, 404, 404 indicative of an example of operation of the magnetic field sensor 100 of FIGS. 1 and 2. Operation is more fully described below M conjunction with FIGS. 5-10.

Figure 5:
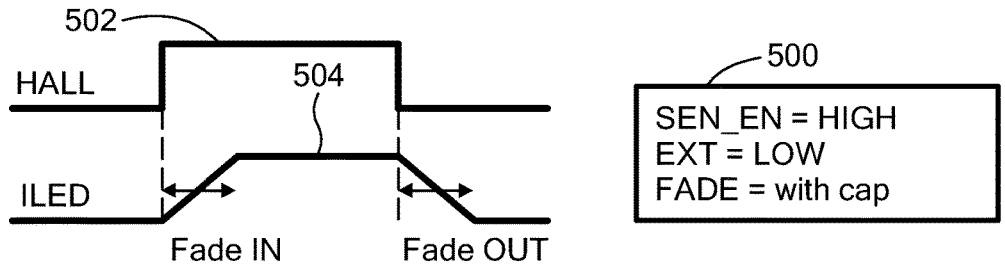
FIGS. 5-10 are a series of graphs representing various behaviors of the integrated magnetic field sensor of FIG. 2.

Referring now to FIG. 5, a signal 502 is indicative of the two-state signal 210a (e.g., a voltage signal) of FIG. 2 generated in response to a magnetic field sensed by the Hall effect element 200.

A signal 504 is representative of the power driving signal 224a (e.g., a current signal) of FIG. 2 generated in response to the signal 502. The signal 504 has slew rate limits on rising and falling edges as may be provided, for example, by the slew limit circuit 216 of FIG. 2. The signal 504 achieves a higher power state approximately coincident with the high state of the signal 502.

Conditions 500 indicate signals similarly named in FIG. 2.

Figure 6:
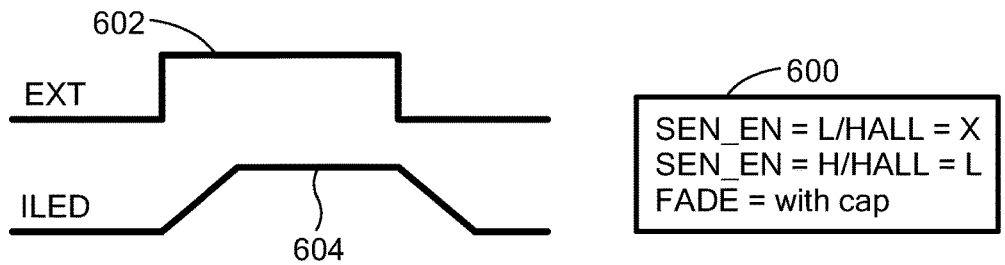

Referring now to FIG. 6, a signal 602 is indicative of the signal 240 of FIG. 2, i.e., an external signal that can be used to externally turn on the light 112.

A signal 604 is representative of the power driving signal 224a (e.g., a current signal) of FIG. 2 generated in response to the signal 602. The signal 604 has slew rate limits on rising and falling edges as may be provided, for example, by the slew limit circuit 216 of FIG. 2. The signal 604 achieves a higher power state approximately coincident with the high state of the signal 602.

Conditions 600 indicate signals similarly named in FIG. 2.

Figure 7:
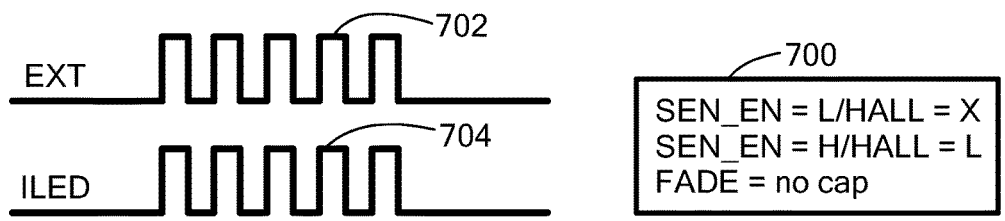

Referring now to FIG. 7, a signal 702 is indicative of the signal 240 of FIG. 2, i.e., an external signal that can be used to externally turn on the light 112. Unlike the signal 602 of FIG. 6, the signal 702 is pulsed in nature. The signal 702 is intended to indicate a PWM (pulse width modulated) signal that can occur during the high state of the signal 602.

A signal 704 is representative of the power driving signal 224a (e.g., a current signal) of FIG. 2 generated in response to the signal 702. The signal 704 does not have slew rate limits. The signal 704 achieves a higher power state approximately coincident with the high state of the signal 702. It should be appreciated that a duty cycle of the signal 702 can alter a brightness of the light 112 of FIG. 2.

If the signal 702 with the pulsed characteristic were to occur during a first turn on time or a turnoff time of the power driving signal 224a, such as during the ramp-up and ramp-down portions of the signal 604 of FIG. 6, similarly, pulses of the signal 704 can ramp up and/or ramp down.

Conditions 700 indicate signals similarly named in FIG. 2.

Figure 8:
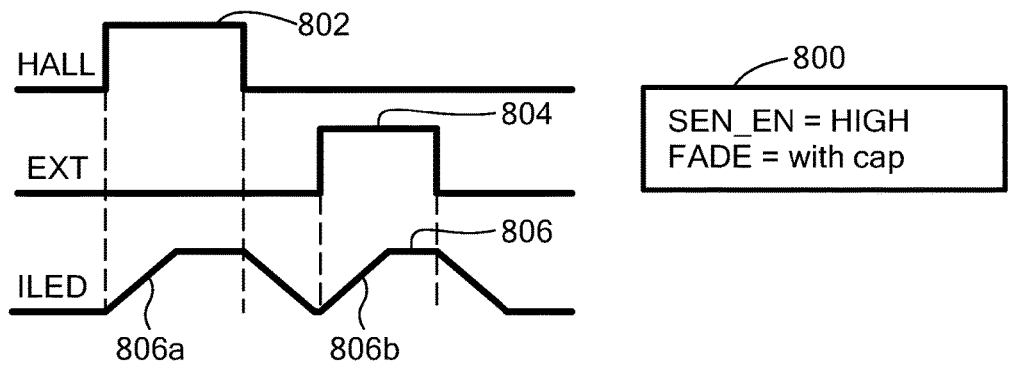

Referring now to FIG. 8, a signal 802 is like the signal 502 of FIG. 5. A signal 804 is like the external signal 602 of FIG. 6. A signal 806 is representative of the power driving signal 224a of FIG. 2 in response to the signals 802, 804. The signal 806 has portions 806a, 806b, each having ramp-up and ramp down portions and a higher power portion as may be provided, for example, by the slew limit circuit 216 of FIG. 2. The signal 806 achieves the portion 806a approximately coincident with a high state of the signal 802. The signal 806 achieves the portion 806b approximately coincident with a high state of the signal 804.

Conditions 800 indicate signals similarly named in FIG. 2.

Figure 9:
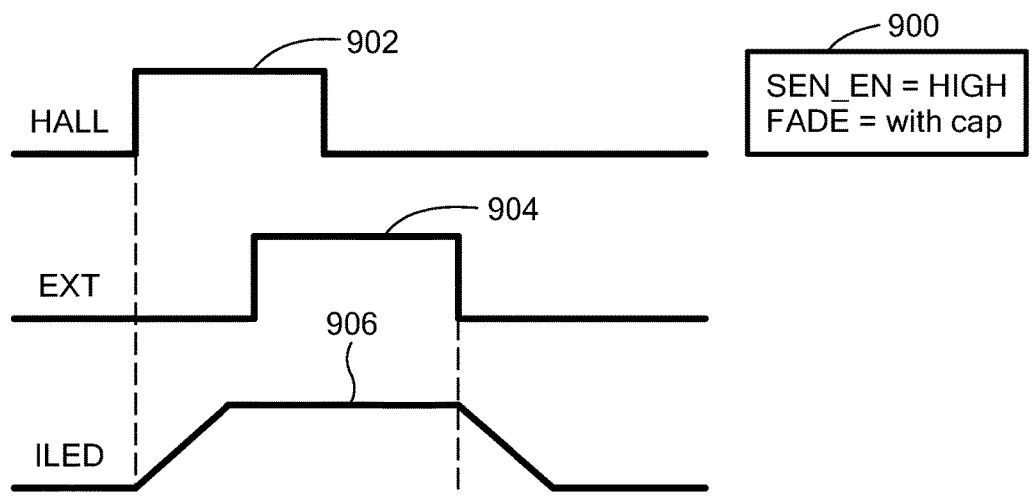

Referring now to FIG. 9, a signal 902 is like the signal 502 of FIG. 5. A signal 904 is like the external signal 602 of FIG. 6. A signal 906 is representative of the power driving signal 224a of FIG. 2 in response to the signals 902, 904. The signal 1006 has slew rate limits on rising and falling edges as may be provided, for example, by the slew limit circuit 216 of FIG. 2. The signal 906 achieves a higher power state approximately coincident with an OR function of the signals 902, 904.

Conditions 900 indicate signals similarly named in FIG. 2.

Figure 10:
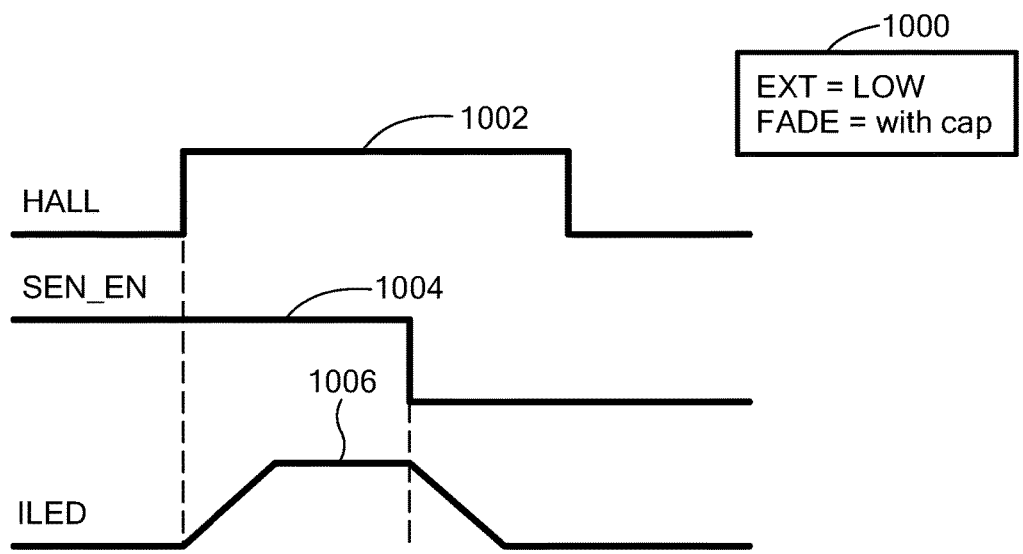

Referring now to FIG. 10, a signal 1002 is like the signal 502 of FIG. 5. A signal 1004 is representative of the enable signal 238 of FIG. 2. A signal 1006 is representative of the power driving signal 224a of FIG. 2 in response to the signals 1002, 1004. The signal 1006 has slew rate limits on rising and falling edges as may be provided, for example, by the slew limit circuit 216 of FIG. 2. The signal 1006 achieves a higher power state approximately coincident with an AND function of the signals 1002, 1004.

Conditions 1000 indicate signals similarly named in FIG. 2.

Figure 11:
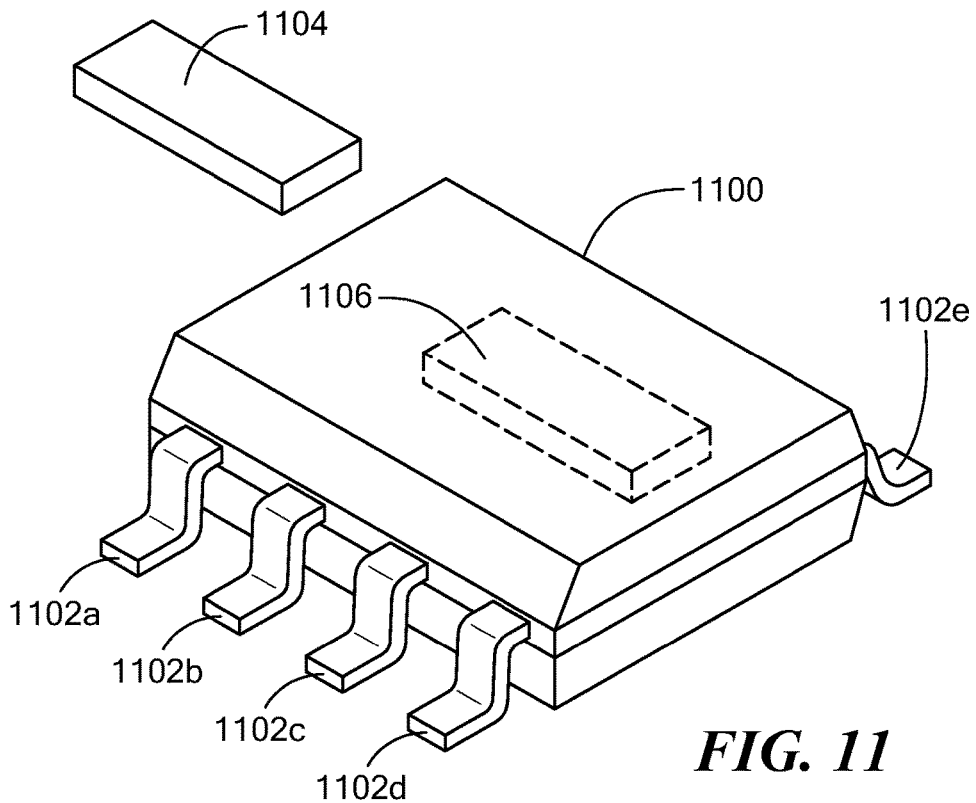
FIGS. 11 and 12 are pictorial diagrams showing a packaging of the integrated magnetic field sensor of FIG. 2.
Figure 12:
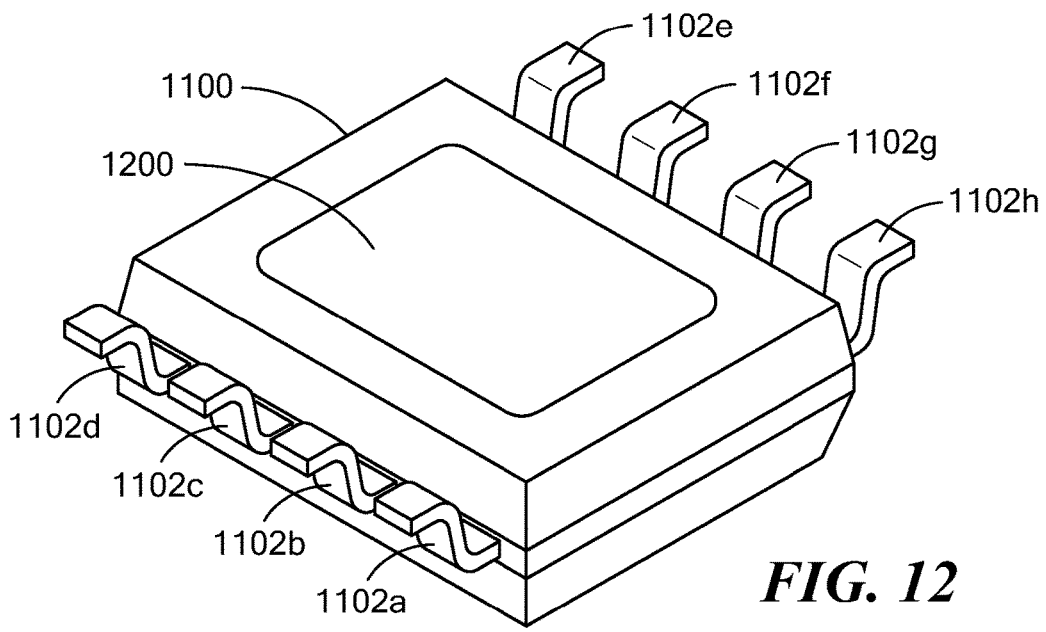

Referring now to FIGS. 11 and 12 in which like elements are shown having like reference designations, the above-described substrate 101 of the magnetic field sensor 100 can be mounted within a so-called LJ SOIC integrated circuit package 1100 having a plurality of pins, for example, eight pins 1102a-1102h.

The integrated circuit package 1100 can include, on a bottom side thereof closest to a circuit board on which the integrated circuit mounts, an exposed thermal pad 1200, which may or may not be mechanically coupled to the substrate 101. In some embodiments, the thermal pad 1200 forms a die bonding pad upon which the above-described substrate 101 is bonded. In other embodiments, the thermal pad 1200 is separate from but thermally coupled to the die bonding pad.

When mounted to a circuit board, the leads 1102a-1102h can be soldered to the circuit board, and the thermal pad 1200 can also be soldered to the circuit board. However, in other embodiments, the thermal pad can be coupled to the circuit board by touching rather than soldering. In some embodiments, a thermal paste (thermally conductive paste) is applied between the thermal pad 1200 and the circuit board.

In some embodiments, the thermal pad 1200 is comprised of a ferromagnetic material, for example, nickel plated steel. The thermal pad 1200 can have no permanent magnetism, but, being ferromagnetic, the thermal pad can achieve aligned magnetic domains in the presence of an external magnetic field. This behavior is not particularly desirable when the magnetic field sensor 100 within the integrated circuit package 1100 is intended to be responsive to an external permanent magnet, e.g., a magnet 1104 that may be attached to an automobile door or the like.

In essence, the magnetic field generated within the thermal pad 1200 when exposed to the permanent magnet 1104 tends to oppose the magnetic field generated by the magnet 1104. Thus, it is desirable that the thermal pad 1200 have a relatively low magnetic permeability. To this end, in some embodiments, the thermal pad is comprised of Aluminum.

It is also desirable that the magnetic field sensing elements, e.g., 200 of FIG. 2, disposed upon the substrate 101 within the integrated circuit package 1100 be placed at a position so as to be minimally influenced by the ferromagnetic material of the thermal pad 1200.

The magnetic field sensor 100 within the integrated circuit package can be responsive to the magnet 1104, which can move.

In some embodiments, the integrated circuit package 1100 can include not only the substrate 101 of FIG. 2, but also, optionally, a permanent magnet 1106, in order to provide a back-biased arrangement. The permanent magnet 1104 can be the same as the back biasing magnet 242 of FIG. 2. In these arrangements, the magnet 1104 is not used, but is replaced by a ferromagnetic object that has very low or zero permanent magnetism. As described above, the ferromagnetic object can influence the magnetic field generated by the optional magnet 1106, and the influence can be sensed.

In some embodiments, the magnet 1106 is encapsulated within plastic material of the integrated circuit package 1100 using one molding step to encapsulate both the substrate 101 and the magnet 1106. In other embodiments, the two separate molding steps are used. In other embodiments, the magnet 1106 is adhered to an outside surface of the integrated circuit package 1100 using adhesive or the like.

The above described substrate bonding pads 101a, 101b, 101c, 101d, 101e, 101f, 101g, 101h can be coupled electrically to selected ones of the pins 1102a-1102h, in any order, by way of wire bonds, solder balls, or the like.

Undesirably, current of the power driving signal 224a of FIG. 2 can generate a magnetic field that can interfere with a magnetic field a magnetic field generated by the magnets 1104 or 1106, sensed by the magnetic field sensing element(s) 200. Thus it is desirable to provide a separation of a pin (and internal wire bond) used to output the power driving signal 224a of FIG. 2 from magnetic field sensing element(s), e.g., 200. For example, pin 1102h can be coupled to output the power driving signal 224a, and the magnetic field sensing element(s) can be disposed at the other end of the integrated circuit package 1100, e.g., between pins 1102d and 1102e.

Similar design considerations can apply to the substrate 101, where the power driving circuit 108 can be separated from the magnetic field sensing circuit(s) 102.

While an eight pin SOJ type (LJ) package is shown, other integrated circuit packages with thermal heat sinking are possible.

Applications of the above-described magnetic field sensor 100 can include, but are not limited to:

an actuator for an automobile glove box light or other indicator upon opening the glove box;

an actuator for an automobile interior light or other indicator upon opening a door;

an actuator for an automobile hood light or trunk light or other indicator upon opening a hood or trunk;

an actuator for an automobile vanity mirror light or other indicator upon opening a vanity light cover;

an actuator for an automobile center console light or other indicator upon opening a door; and an actuator for an appliance, e.g., for a refrigerator light.

Figure 13:
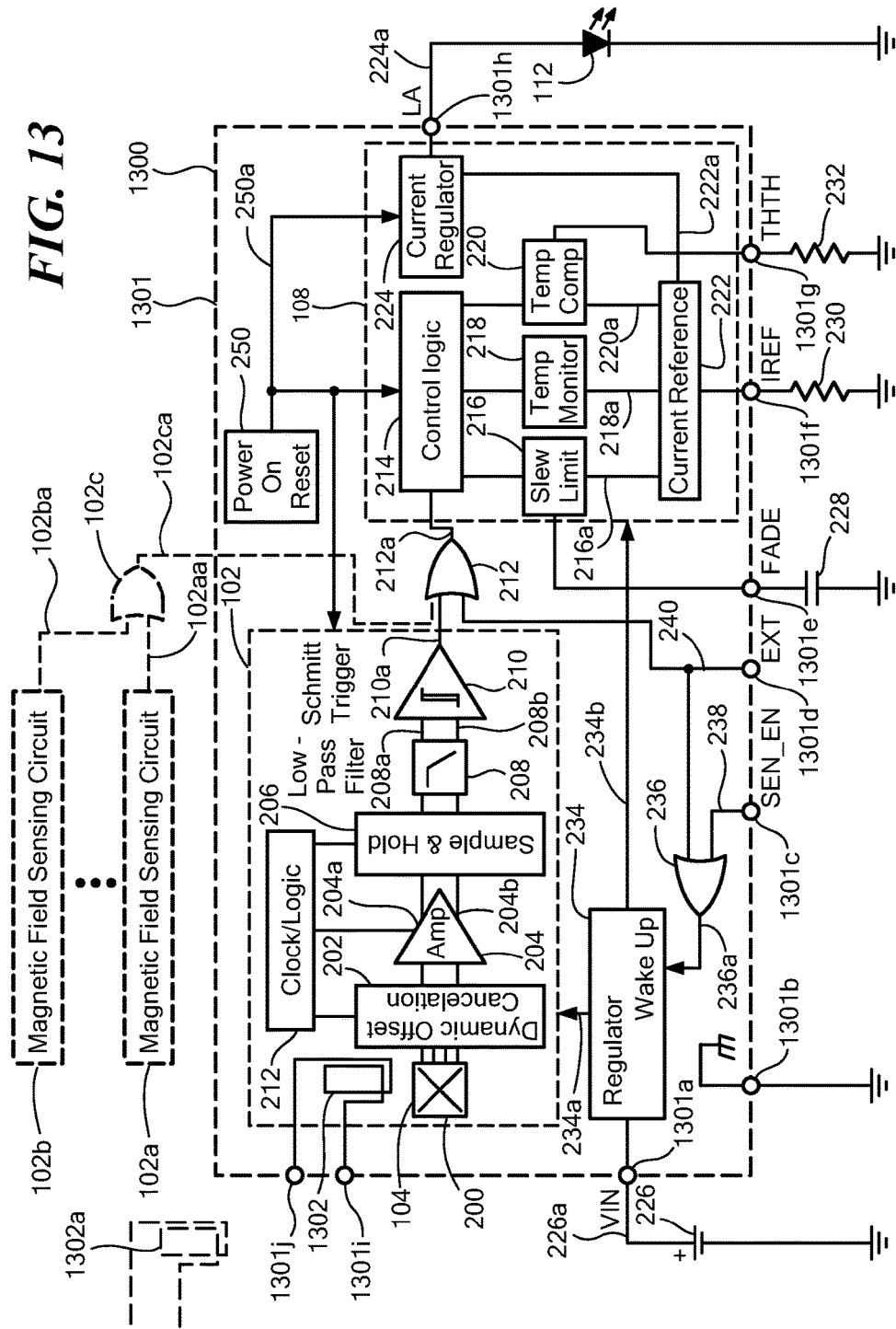
FIG. 13 is a schematic diagram showing details of an example of another integrated magnetic field sensor and responsive to a magnetic field in a conductor and showing further examples of an illustrative magnetic field sensing circuit and an illustrative power driving circuit as used in FIG. 1.

Referring now or FIG. 13, in which like elements of FIG. 2 are shown having like reference designations, a magnetic field sensor 1300 can include a substrate 1301 with bonding pads 1301*a*-1301*h*, which are the same as or similar to the bonding pages 101*a*-101*h* of FIG. 2. Unlike the substrate 101 of FIG. 2, the substrate 1301 can include bonding pads 1301*i*, 1301*j* coupled to a current conductor 1302, e.g., coil 1302, disposed upon or within the substrate 1301 and proximate to the magnetic field sensing element 200.

In some embodiments, the bonding pads are electrically coupled to integrated circuit pins, in which case, there can be more than the above-described eight integrated circuit pins.

In some other embodiments, one end of the coil is coupled to the ground pin 1301*b* and one of the pins 1301*i*, 1301*j* is not needed.

As described above, the magnetic field sensor 100 of FIG. 2 can be responsive to a magnet, either an external magnet or a back-biasing magnet. Instead, the magnetic field sensor 1300 can be responsive to a magnetic field resulting from a current applied to the coil 1302. The current applied to the coil can be less than, greater than, or equal to the current of the power driving signal 224*a*. The magnetic field sensor 1300 is operable to isolate the current applied to the coil 1302 from the current of the power driving signal 224*a*.

In some embodiments, the current applied to the coil 1302 (or 1302*a*, see below) is an activation current, as in a relay, in which case, the power driving signal 224*a* is activated when the activation current is above a threshold current. In these embodiments, the coil 1302 (or 1302*a*, see below) can be sized (number of turns (loops), resistance, and diameter) so that the threshold current can be any current, e.g., high or low.

In some embodiments, the current applied to the coil 1302 (or 1302*a*, see below) is a current that is measured, as in a current sensor, in which case, the power driving signal 224*a* is activated when the current that is measured is above a threshold current. In these embodiments, the coil 1302 (or 1302*a*, see below) can be sized (number of turns (loops), resistance, and diameter) so that the threshold current can be any current, e.g., high or low.

In some embodiments, the current applied to the coil 1302 (or 1302*a*, see below) is part of a self-test arrangement described more fully below in conjunction with FIG. 23, and the magnetic field sensor 104 can be responsive to a magnetic field generated by the coil 1302 (or 1302*a*, see below) only at some times, and the magnetic field sensor 104 can be responsive to other magnetic fields at other times.

The coil 1302 can have any number of closed loops, including no closed loops, in which case, the coil 1302 is instead a conductor for generating a magnetic field. Illustrative embodiments of the coil 1302 are described below in conjunction with FIGS. 14, 15, and 16.

The coil 1302 can be formed in one or more metal layers of the substrate 1301. In other embodiments, optionally a coil, e.g., 1302*a*, in place of the coil 1302, is not disposed upon or within the substrate, but is instead, for example, a wire, disposed proximate to the substrate 1301, for example, within a molding compound of a plastic integrated circuit package, and proximate to the magnetic field sensing element 200. In still other embodiments, optionally the coil, e.g., 1302*a*, in place of the coil 1302 is not disposed upon or within the substrate and not disposed within the associated integrated circuit package, but is instead external to the integrated circuit package (and proximate to the magnetic field sensing element), in which case, the bonding pads 1301*i*, 1301*j* are not used.

Some, but not all, suitable types of coils are described, for example, in U.S. Pat. No. 8,447,556, issued May 21, 2013, U.S. patent application Ser. No. 13/748,999, filed Jan. 24, 2013, and U.S. patent application Ser. No. 13/946,400, filed Jul. 19, 2013, each of which is assigned to the assignee of the present application, and each of which is incorporated by reference herein in its entirety.

In some embodiments, a mere conductor is used in place of the coils 1302, 1302*a*. Examples of coils and conductors are described in conjunction with FIGS. 14-16 below.

Figure 14:
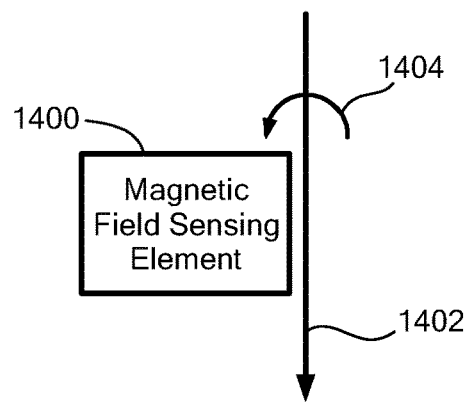
FIGS. 14-16 are pictorial diagrams of conductors that may be used as the conductor of FIG. 13.

Referring now to FIG. 14, a magnetic field sensing element 1400 can be the same as or similar to the magnetic field sensing element 104 of FIGS. 1, 2, and 13. A conductor 1402 can be the same as or similar to the coils 1302, 1302*a* of FIG. 13. A current passing through the conductor 1402 can generate a magnetic field 1404 that is circular around the conductor 1402.

The magnetic field sensing element 1400 is shown to the side of the current conductor 1402, and therefore, the magnetic field 1404 passes through the magnetic field sensing element 1400 in a vertical direction (into the page), as may be useful for a planar Hall effect element.

In other embodiments, the magnetic field sensing element 1400 can instead be disposed on or under the current conductor 1402, where the magnetic field 1404 can be parallel to the magnetic field sensing element 1400, as may be useful for a magnetoresistance element or a vertical Hall effect element.

In some embodiments, the conductor 1402 is within a metal layer upon an integrated circuit substrate, e.g., the substrate 101 of FIG. 13. In other embodiments, the conductor 1402 is not on the substrate 101 but is within a package surrounding the magnetic field sensor 100. In some other embodiments, the conductor 1402 is not on the substrate 101 and is associated with a separate element, for example, the conductor 1402 can be within a metal layer upon a circuit board (not shown) on which the magnetic field sensor 100 is soldered.

Figure 15:
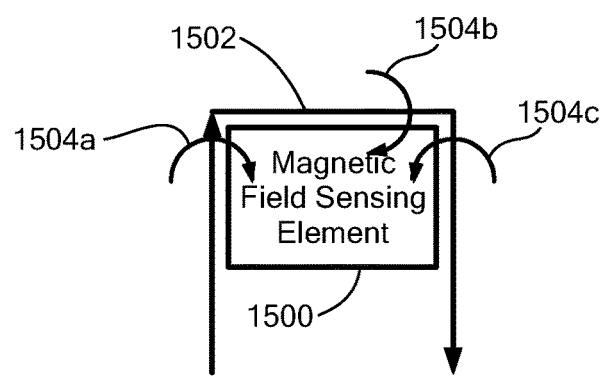

Referring now to FIG. 15, a magnetic field sensing element 1500 can be the same as or similar to the magnetic field sensing element 104 of FIGS. 1, 2, and 13. A conductor 1502 can be the same as or similar to the coils 1302, 1302*a* of FIG. 13. The conductor 1502 can partially surround the magnetic field sensing element 1500. A current passing through the conductor 1502 can generate a magnetic fields 1504*a*, 1504*b*, 1504*c* circular around the conductor 1502.

The magnetic field sensing element 1500 is shown to the side of the current conductor 1502 (i.e., within the partial loop), and therefore, the magnetic field 1504*a*, 1504*b*, 1504*c* passes through the magnetic field sensing element 1500 in a vertical direction (into the page), as may be useful for a planar Hall effect element. The magnetic field sensing element 1500 could also be outside of the partial loop.

In other embodiments, the magnetic field sensing element 1500 can instead be disposed on or under the current conductor 1502, where the magnetic field 1504*a*, 1504*b*, 1504*c* can be parallel to the magnetic field sensing element 1500, as may be useful for a magnetoresistance element or a vertical Hall effect element.

In some embodiments, the conductor 1502 is within a metal lager upon an integrated circuit substrate, e.g., the substrate 101 of FIG. 13. In other embodiments, the conductor 1502 is not on the substrate 101 but is within a package surrounding the magnetic field sensor 100. In some other embodiments, the conductor 1502 is not on the substrate 101 and is associated. with a separate element, for example, the conductor 1502 can be within a metal layer upon a circuit board (not shown) on which the magnetic field sensor 100 is soldered.

Figure 16:
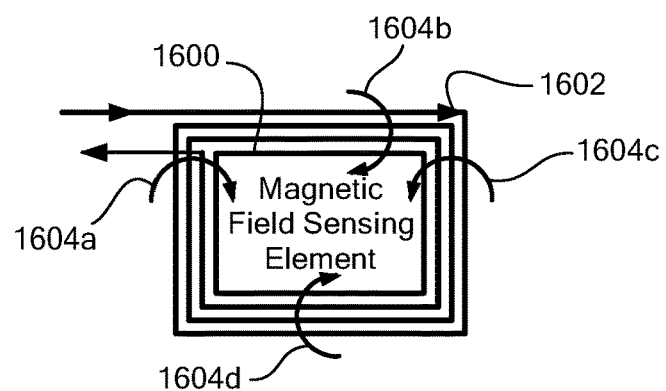

Referring now to FIG. 16, a magnetic field sensing element 1600 can be the same as or similar to the magnetic field sensing element 104 of FIGS. 1, 2, and 13. A conductor 1602 (i.e., a coil) can be the same as or similar to the coils 1302, 1302a of FIG. 13. The conductor 1602 can surround the magnetic field sensing element 1600. A current passing through the conductor 1602 can generate a magnetic field 1604a, 1604b, 1604c, 1604d circular around the conductor 1602.

The magnetic field sensing element 1600 is shown to be within the coil 1602, and therefore, the magnetic field 1604a, 1604b, 1604c, 1604d passes through the magnetic field. sensing element 1600 in a vertical direction (into the page), as may be useful for a planar Hall effect element. The magnetic field sensing element 1600 could also be outside of the coil 1602.

In other embodiments the magnetic field sensing element 1500 can instead be disposed on or under the current conductor coil 1602, where the magnetic field 1604a, 1604b, 1604c, 1604d can be parallel to the magnetic field sensing element 1600, as may be useful for a magnetoresistance element or a vertical Hall effect element.

In some embodiments, the conductor 1602 is within more than one metal layer upon an integrated circuit substrate, e.g., the substrate 101 of FIG. 13. In other embodiments, the conductor 1602 is not on the substrate 101 but is within a package surrounding the magnetic field sensor 100. In some other embodiments, the conductor 1602 is not on the substrate 101 and is associated with a separate element, for example, the conductor 1602 can be within more than one metal layer upon a circuit board (not shown) on which the magnetic field sensor 100 is soldered.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An integrated magnetic field sensor comprising:
a semiconductor substrate disposed within an integrated circuit package, wherein the integrated circuit package comprises a thermal pad configured to thermally couple the substrate to a circuit board;
a magnetic field sensing circuit disposed upon or within the substrate and operable to generate a two-state signal responsive to a magnetic field; and
a power driving circuit disposed upon or within the substrate and operable to generate, in response to the two-state signal, a power driving signal having a higher power state and a lower power state.

2. The integrated magnetic field sensor of claim 1, wherein the higher power state is operable to provide at least one hundred seventy milliamps of current.

3. The integrated magnetic field sensor of claim 2, wherein the integrated magnetic field sensor is operable up to an environmental temperature of about one hundred twenty five degrees Celsius.

4. The integrated magnetic field sensor of claim 3, wherein the power driving circuit comprises:
a temperature sensor disposed upon or within the substrate; and
a temperature compensation circuit responsive to the temperature sensor and operable to reduce the higher power state of the power driving signal to a reduced power state at environmental temperatures above a threshold temperature.

5. The integrated magnetic field sensor of claim 4, wherein the threshold temperature is determined by a passive electronic component coupled to the integrated magnetic field sensor.

6. The integrated magnetic field sensor of claim 5, wherein the threshold temperature comprises a plurality of threshold temperatures and wherein the temperature compensation circuit is operable to reduce the higher power state of the power driving signal to a corresponding plurality of different reduced power states at environmental temperatures above respective ones of the plurality of threshold temperatures.

7. The integrated magnetic field sensor of claim 5, wherein the power driving circuit further comprises:
a slew limit circuit operable to limit a rate of change of the power driving signal between the higher power and lower power states.

8. The integrated magnetic field sensor of claim 5, further comprising:
a permanent magnet coupled to the integrated circuit package for generating the magnetic field.

9. The integrated magnetic field sensor of claim 5, wherein the integrated circuit package further comprises:
a conductor disposed upon or within the semiconductor substrate and proximate to the magnetic field sensing circuit, the conductor for generating the magnetic field.

10. The integrated magnetic field sensor of claim 1, wherein the magnetic field sensing circuit comprises:
a magnetic field sensing element disposed upon the semiconductor substrate;
a conductor disposed upon the semiconductor and proximate to the magnetic field sensing element; and
a self-test circuit operable to drive a current into the conductor to generate a self-test of the integrated magnetic field sensor.

11. The integrated magnetic field sensor of claim 1, wherein the magnetic field sensing circuit comprises:
a power on reset circuit operable to hold the two-state signal or to hold the power driving circuit into a condition to result in the lower power state for a predetermined time period following a time when power is applied to the integrated magnetic field sensor.

12. The integrated magnetic field sensor of claim 1, wherein the higher power state is operable to provide at least one hundred seventy milliamps of current, wherein the magnetic field sensing circuit comprises a Hall effect element having first, second, third, and fourth electrical connection nodes disposed upon the semiconductor substrate, and wherein the power driving circuit is disposed upon the semiconductor substrate at a position to result in a predetermined thermal gradient direction at a position of the Hall effect element with respect to positions of the first, second, third, and fourth connections nodes.

13. The integrated magnetic field sensor of claim 1, wherein the higher power state is operable to provide at least one hundred seventy milliamps of current, and wherein the magnetic field sensing circuit comprises a Hall effect element disposed upon the semiconductor substrate, and wherein the power driving circuit is disposed at a position upon the semiconductor substrate to result in a thermal gradient at a position of the Hall effect element smaller than one degree Celsius.

14. A method of powering on and off a load, comprising:
providing an integrated magnetic field sensor, the integrated magnetic field sensor comprising:
a semiconductor substrate disposed within an integrated circuit package, wherein the integrated circuit package comprises a thermal pad configured to thermally couple the substrate to a circuit board;
a magnetic field sensing circuit disposed upon or within the substrate and operable to generate a two-state signal responsive to a magnetic field; and
a power driving circuit disposed upon or within the substrate and operable to generate, in response to the two-state signal, a power driving signal having a higher power state and a lower power state, the method further comprising:
sensing a change of the magnetic field with the integrated magnetic field sensor, wherein the higher power state and the lower power state are achieved at different respective strengths or angles of the magnetic field.

15. The method of claim 14, wherein the load is an automobile light.

16. The method of claim 15, further comprising:
generating the magnetic field with a back-biasing magnet, the magnetic field influenced by a ferromagnetic object.

17. The method of claim 15, wherein the higher power state is operable to provide at least one hundred seventy milliamps of current.

18. The method of claim 17, wherein the integrated magnetic field sensor is operable up to an environmental temperature of about one hundred twenty five degrees Celsius.

19. The method of claim 18, wherein the power driving circuit comprises:
a temperature sensor disposed upon or within the substrate; and
a temperature compensation circuit responsive to the temperature sensor and operable to reduce the higher power state of the power driving signal to a reduced power state at environmental temperatures above a threshold temperature.

20. The method of claim 19, wherein the threshold temperature is determined by a passive electronic component coupled to the integrated magnetic field sensor.

21. The method of claim 20, wherein the threshold temperature comprises a plurality of threshold temperatures and wherein the temperature compensation circuit is operable to reduce the higher power state of the power driving signal to a corresponding plurality of different reduced power states at environmental temperatures above respective ones of the plurality of threshold temperatures.

22. The method of claim 20, wherein the power driving circuit further comprises:
a slew limit circuit operable to limit a rate of change of the power driving signal between the higher power and lower power states.

23. The method of claim 20, further comprising:
generating the magnetic field with a permanent magnet.

24. The method of claim 20, further comprising:
generating the magnetic field with a conductor.

25. The method of claim 14, wherein the magnetic field sensing circuit comprises:
a magnetic field sensing element disposed upon the semiconductor substrate;
a conductor disposed upon the semiconductor and proximate to the magnetic field sensing element; and
a self-test circuit operable to drive a current into the conductor to generate a self-test of the integrated magnetic field sensor.

26. The method of claim 14, wherein the magnetic field sensing circuit comprises:
a power on reset circuit operable to hold the two-state signal or to hold the power driving circuit into a condition to result in the lower power state for a predetermined time period following a time when power is applied to the integrated magnetic field sensor.

27. The method of claim 14, wherein the higher power state is operable to provide at least one hundred seventy milliamps of current, wherein the magnetic field sensing circuit comprises a Hall effect element having first, second, third, and fourth electrical connection nodes disposed upon the semiconductor substrate, and wherein the power driving circuit is disposed at a position upon the semiconductor substrate to result in a predetermined thermal gradient direction at a position of the Hall effect element with respect to positions of the first, second, third, and fourth connections nodes.

28. The method of claim 14, wherein the higher power state is operable to provide at least one hundred seventy milliamps of current, and wherein the magnetic field sensing circuit comprises a Hall effect element disposed upon the semiconductor substrate, and wherein the power driving circuit is disposed at a position upon the semiconductor substrate to result in a thermal gradient at a position of the Hall effect element smaller than one degree Celsius.

29. An integrated magnetic field sensor comprising:
a semiconductor substrate disposed within an integrated circuit package;
a permanent magnet coupled to the integrated circuit package for generating a magnetic field;
a magnetic field sensing circuit disposed upon or within the substrate and operable to generate a two-state signal responsive to the magnetic field; and
a power driving circuit disposed upon or within the substrate and operable to generate, in response to the two-state signal, a power driving signal having a higher power state and a lower power state.

30. The integrated magnetic field sensor of claim 29, wherein the power driving circuit comprises:
a temperature sensor disposed upon or within the substrate; and
a temperature compensation circuit responsive to the temperature sensor and operable to reduce the higher power state of the power driving signal to a reduced power state at environmental temperatures above a threshold temperature.

31. The integrated magnetic field sensor of claim 30, wherein the threshold temperature is determined by a passive electronic component coupled to the integrated magnetic field sensor.

32. The integrated magnetic field sensor of claim 30, wherein the threshold temperature comprises a plurality of threshold temperatures and wherein the temperature compensation circuit is operable to reduce the higher power state of the power driving signal to a corresponding plurality of different reduced power states at environmental temperatures above respective ones of the plurality of threshold temperatures.

33. A method of powering on and off a load, comprising:
providing an integrated magnetic field sensor, the integrated magnetic field sensor comprising:
a semiconductor substrate disposed within an integrated circuit package;
a permanent magnet coupled to the integrated circuit package for generating a magnetic field;
a magnetic field sensing circuit disposed upon or within the substrate and operable to generate a two-state signal responsive to the magnetic field; and
a power driving circuit disposed upon or within the substrate and operable to generate, in response to the two-state signal, a power driving signal having a higher power state and a lower power state, the method further comprising:
sensing a change of the magnetic field with the integrated magnetic field sensor, wherein the higher power state and the lower power state are achieved at different respective strengths or angles of the magnetic field.

34. The method of claim 33, wherein the power driving circuit comprises:
a temperature sensor disposed upon or within the substrate; and
a temperature compensation circuit responsive to the temperature sensor and operable to reduce the higher power state of the power driving signal to a reduced power state at environmental temperatures above a threshold temperature.

35. The method of claim 34, wherein the threshold temperature is determined by a passive electronic component coupled to the integrated magnetic field sensor.

36. The method of claim 34, wherein the threshold temperature comprises a plurality of threshold temperatures and wherein the temperature compensation circuit is operable to reduce the higher power state of the power driving signal to a corresponding plurality of different reduced power states at environmental temperatures above respective ones of the plurality of threshold temperatures.

37. An integrated magnetic field sensor comprising:
a semiconductor substrate disposed within an integrated circuit package;
a magnetic field sensing circuit disposed upon or within the substrate and operable to generate a two-state signal responsive to a magnetic field; and
a power driving circuit disposed upon or within the substrate and operable to generate, in response to the two-state signal, a power driving signal having a higher power state and a lower power state, wherein the power driving circuit comprises:
a temperature sensor disposed upon or within the substrate; and
a temperature compensation circuit responsive to the temperature sensor and operable to reduce the higher power state of the power driving signal to a reduced power state at environmental temperatures above a threshold temperature.

38. The integrated magnetic field sensor of claim 37, wherein the integrated magnetic field sensor further comprises a permanent magnet for generating the magnetic field.

39. The integrated magnetic field sensor of claim 37, wherein the threshold temperature is determined by a passive electronic component coupled to the integrated magnetic field sensor.

40. The integrated magnetic field sensor of claim 37, wherein the threshold temperature comprises a plurality of threshold temperatures and wherein the temperature compensation circuit is operable to reduce the higher power state of the power driving signal to a corresponding plurality of different reduced power states at environmental temperatures above respective ones of the plurality of threshold temperatures.

41. A method of powering on and off a load, comprising:
providing an integrated magnetic field sensor, the integrated magnetic field sensor comprising:
a semiconductor substrate disposed within an integrated circuit package;
a magnetic field sensing circuit disposed upon or within the substrate and operable to generate a two-state signal responsive to a magnetic field; and
a power driving circuit disposed upon or within the substrate and operable to generate, in response to the two-state signal, a power driving signal having a higher power state and a lower power state, wherein the power driving circuit comprises:
a temperature sensor disposed upon or within the substrate; and
a temperature compensation circuit responsive to the temperature sensor and operable to reduce the higher power state of the power driving signal to a reduced power state at environmental temperatures above a threshold temperature, the method further comprising:
sensing a change of the magnetic field with the integrated magnetic field sensor, wherein the higher power state and the lower power state are achieved at different respective strengths or angles of the magnetic field.

42. The method of claim 41, wherein the integrated magnetic field sensor further comprises a permanent magnet for generating the magnetic field.

43. The method of claim 41, wherein the threshold temperature is determined by a passive electronic component coupled to the integrated magnetic field sensor.

44. The method of claim 41, wherein the threshold temperature comprises a plurality of threshold temperatures and wherein the temperature compensation circuit is operable to reduce the higher power state of the power driving signal to a corresponding plurality of different reduced power states at environmental temperatures above respective ones of the plurality of threshold temperatures.

45. An integrated magnetic field sensor comprising:
a semiconductor substrate disposed within an integrated circuit package;
a magnetic field sensing circuit disposed upon or within the substrate and operable to generate a two-state signal responsive to a magnetic field, wherein the magnetic field sensing circuit comprises:
a magnetic field sensing element disposed upon the semiconductor substrate;
a conductor disposed upon the semiconductor and proximate to the magnetic field sensing element; and
a self-test circuit operable to drive a current into the conductor to generate a self-test of the integrated magnetic field sensor, wherein the integrated magnetic field sensor further comprises:
a power driving circuit disposed upon or within the substrate and operable to generate, in response to the two-state signal, a power driving signal having a higher power state and a lower power state.

46. The integrated magnetic field sensor of claim 45, further comprising:
a temperature sensor disposed upon or within the substrate; and
a temperature compensation circuit responsive to the temperature sensor and operable to reduce the higher power state of the power driving signal to a reduced power state at environmental temperatures above a threshold temperature.

47. The integrated magnetic field sensor of claim 46, wherein the threshold temperature is determined by a passive electronic component coupled to the integrated magnetic field sensor.

48. An integrated magnetic field sensor comprising:
a semiconductor substrate disposed within an integrated circuit package;
a magnetic field sensing circuit disposed upon or within the substrate and operable to generate a two-state signal responsive to a magnetic field, wherein the magnetic field sensing circuit comprises:
a power on reset circuit operable to hold the two-state signal or to hold the power driving circuit into a condition to result in the lower power state for a predetermined time period following a time when power is applied to the integrated magnetic field sensor, wherein the integrated magnetic field sensor further comprises:
a power driving circuit disposed upon or within the substrate and operable to generate, in response to the two-state signal, a power driving signal having a higher power state and a lower power state.

49. The integrated magnetic field sensor of claim 48, further comprising:
a temperature sensor disposed upon or within the substrate; and
a temperature compensation circuit responsive to the temperature sensor and operable to reduce the higher power state of the power driving signal to a reduced power state at environmental temperatures above a threshold temperature.

50. The integrated magnetic field sensor of claim 49, wherein the threshold temperature is determined by a passive electronic component coupled to the integrated magnetic field sensor.

51. An integrated magnetic field sensor comprising:
a semiconductor substrate disposed within an integrated circuit package;
a magnetic field sensing circuit disposed upon or within the substrate and operable to generate a two-state signal responsive to a magnetic field; and
a power driving circuit disposed upon or within the substrate and operable to generate, in response to the two-state signal, a power driving signal having a higher power state and a lower power state, wherein the higher power state is operable to provide at least one hundred seventy milliamps of current, wherein the magnetic field sensing circuit comprises a Hall effect element having first, second, third, and fourth electrical connection nodes disposed upon the semiconductor substrate, and wherein the power driving circuit is disposed upon the semiconductor substrate at a position to result in a predetermined thermal gradient direction at a position of the Hall effect element with respect to positions of the first, second, third, and fourth connections nodes.

52. The integrated magnetic field sensor of claim 51, further comprising:
a temperature sensor disposed upon or within the substrate; and
a temperature compensation circuit responsive to the temperature sensor and operable to reduce the higher power state of the power driving signal to a reduced power state at environmental temperatures above a threshold temperature.

53. The integrated magnetic field sensor of claim 52, wherein the threshold temperature is determined by a passive electronic component coupled to the integrated magnetic field sensor.

54. A method of powering on and off a load, comprising:
providing an integrated magnetic field sensor, the integrated magnetic field sensor comprising:
a semiconductor substrate disposed within an integrated circuit package;
a magnetic field sensing circuit disposed upon or within the substrate and operable to generate a two-state signal responsive to a magnetic field; and
a power driving circuit disposed upon or within the substrate and operable to generate, in response to the two-state signal, a power driving signal having a higher power state and a lower power state, the method further comprising:
sensing a change of the magnetic field with the integrated magnetic field sensor, wherein the higher power state and the lower power state are achieved at different respective strengths or angles of the magnetic field, wherein the higher power state is operable to provide at least one hundred seventy milliamps of current, wherein the magnetic field sensing circuit comprises a Hall effect element having first, second, third, and fourth electrical connection nodes disposed upon the semiconductor substrate, and wherein the power driving circuit is disposed upon the semiconductor substrate at a position to result in a predetermined thermal gradient direction at a position of the Hall effect element with respect to positions of the first, second, third, and fourth connections nodes.

55. The method of claim 54, further comprising:
a temperature sensor disposed upon or within the substrate; and
a temperature compensation circuit responsive to the temperature sensor and operable to reduce the higher power state of the power driving signal to a reduced power state at environmental temperatures above a threshold temperature.

56. An integrated magnetic field sensor comprising:
a semiconductor substrate disposed within an integrated circuit package;
a magnetic field sensing circuit disposed upon or within the substrate and operable to generate a two-state signal responsive to a magnetic field; and
a power driving circuit disposed upon or within the substrate and operable to generate, in response to the two-state signal, a power driving signal having a higher power state and a lower power state, wherein the higher power state is operable to provide at least one hundred seventy milliamps of current, and wherein the magnetic field sensing circuit comprises a Hall effect element disposed upon the semiconductor substrate, and wherein the power driving circuit is disposed at a position upon the semiconductor substrate to result in a thermal gradient at a position of the Hall effect element smaller than one degree Celsius.

57. The integrated magnetic field sensor of claim 56, wherein the power driving circuit comprises:
- a temperature sensor disposed upon or within the substrate; and
- a temperature compensation circuit responsive to the temperature sensor and operable to reduce the higher power state of the power driving signal to a reduced power state at environmental temperatures above a threshold temperature.

58. The integrated magnetic field sensor of claim 57, wherein the threshold temperature is determined by a passive electronic component coupled to the integrated magnetic field sensor.

59. A method of powering on and off a load, comprising:
providing an integrated magnetic field sensor, the integrated magnetic field sensor comprising:
- a semiconductor substrate disposed within an integrated circuit package;
- a magnetic field sensing circuit disposed upon or within the substrate and operable to generate a two-state signal responsive to a magnetic field; and
- a power driving circuit disposed upon or within the substrate and operable to generate, in response to the two-state signal, a power driving signal having a higher power state and a lower power state, the method further comprising:

sensing a change of the magnetic field with the integrated magnetic field sensor, wherein the higher power state and the lower power state are achieved at different respective strengths or angles of the magnetic field, wherein the higher power state is operable to provide at least one hundred seventy milliamps of current, and wherein the magnetic field sensing circuit comprises a Hall effect element disposed upon the semiconductor substrate, and wherein the power driving circuit is disposed at a position upon the semiconductor substrate to result in a thermal gradient at a position of the Hall effect element smaller than one degree Celsius.

60. The method of claim 59, wherein the power driving circuit comprises:
- a temperature sensor disposed upon or within the substrate; and
- a temperature compensation circuit responsive to the temperature sensor and operable to reduce the higher power state of the power driving signal to a reduced power state at environmental temperatures above a threshold temperature.

* * * * *

UNITED STATES PATENT AND TRADEMARK OFFICE
CERTIFICATE OF CORRECTION

| | | |
|---|---|---|
| PATENT NO. | : 10,088,533 B2 | Page 1 of 1 |
| APPLICATION NO. | : 14/993495 | |
| DATED | : October 2, 2018 | |
| INVENTOR(S) | : Manuel Rivas et al. | |

It is certified that error appears in the above-identified patent and that said Letters Patent is hereby corrected as shown below:

On the Title Page

Item (71), delete "Allegro Microsystems, LLC," and replace with --Allegro MicroSystems, LLC,--.
Delete "Worcester, MA," and replace with --Manchester, NH--.

Signed and Sealed this
Eleventh Day of December, 2018

Andrei Iancu
*Director of the United States Patent and Trademark Office*